United States Patent
Zhu et al.

(10) Patent No.: US 10,411,459 B2
(45) Date of Patent: Sep. 10, 2019

(54) PHOTOVOLTAIC POWER GENERATION SYSTEM AND METHOD FOR SHUTTING DOWN THE SAME

(71) Applicant: Delta Electronics (Shanghai) CO., LTD, Shanghai (CN)

(72) Inventors: Xuancai Zhu, Shanghai (CN); Bingwen Weng, Shanghai (CN); Jianming Chen, Shanghai (CN); Yafeng Liao, Shanghai (CN); Jinfa Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/675,996

(22) Filed: Aug. 14, 2017

(65) Prior Publication Data

US 2018/0062379 A1    Mar. 1, 2018

(30) Foreign Application Priority Data

Aug. 23, 2016  (CN) .......................... 2016 1 0711762

(51) Int. Cl.
*H02H 3/30* (2006.01)
*H01L 31/02* (2006.01)
(Continued)

(52) U.S. Cl.
CPC ....... *H02H 3/305* (2013.01); *H01L 31/02021* (2013.01); *H02H 1/0061* (2013.01); (Continued)

(58) Field of Classification Search
CPC .... H02H 3/305; H02H 7/20; H01L 31/02021; H02J 3/383
See application file for complete search history.

(56) References Cited

U.S. PATENT DOCUMENTS 8,319,377 B2    11/2012  Beck
2009/0097172 A1  4/2009  Bremicker et al.
(Continued)

FOREIGN PATENT DOCUMENTS

CN    202333772 U    7/2012
CN    103457303 A    12/2013
(Continued)

OTHER PUBLICATIONS

The CN1OA dated Apr. 29, 2019 by the CNIPA.

*Primary Examiner* — Jue Zhang
*Assistant Examiner* — Kevin H Sprenger
(74) *Attorney, Agent, or Firm* — Yunling Ren

(57) ABSTRACT

A photovoltaic power generation system includes a plurality of photovoltaic arrays, a plurality of shutdown units and an inverter. The shutdown unit is adjacent to the corresponding photovoltaic array, connected in parallel with the corresponding photovoltaic array, and electrically connected to the inverter via high voltage wires; the photovoltaic power generation system further includes a control unit configured to receive a detection signal indicating a state of the AC side of the inverter, monitor whether the AC side of the inverter is in a power-off state according to the detection signal, and generate a first power-off signal when the AC side of the inverter is in the power-off state; and the shutdown units are configured to receive the first power-off signal, and stop a power transmission from the photovoltaic arrays to the inverter according to the first power-off signal.

16 Claims, 7 Drawing Sheets

(51) Int. Cl.
*H02H 7/20* (2006.01)
*H02J 3/38* (2006.01)
*H02H 1/00* (2006.01)

(52) U.S. Cl.
CPC .............. *H02H 7/20* (2013.01); *H02J 3/383* (2013.01); *Y02B 10/14* (2013.01)

(56) References Cited

U.S. PATENT DOCUMENTS

| | | |
|---|---|---|
| 2010/0071744 A1 | 3/2010 | Peurach et al. |
| 2013/0249297 A1* | 9/2013 | Takehara .................. H02J 1/00 307/71 |
| 2013/0271888 A1 | 10/2013 | Falk et al. |
| 2014/0311546 A1 | 10/2014 | Kruse |
| 2017/0110873 A1* | 4/2017 | Glovinski ................ H02H 3/08 |
| 2017/0288599 A1* | 10/2017 | Chapman ................ H02S 10/00 |

FOREIGN PATENT DOCUMENTS

| | | |
|---|---|---|
| CN | 103916074 A | 7/2014 |
| CN | 103929086 A | 7/2014 |
| CN | 104167980 A | 11/2014 |
| CN | 204031043 U | 12/2014 |
| CN | 104319810 A | 1/2015 |
| CN | 105846758 A | 8/2016 |
| WO | 2012040760 A2 | 4/2012 |
| WO | 2013007638 A2 | 1/2013 |
| WO | 2014048459 A1 | 4/2014 |

* cited by examiner

PHOTOVOLTAIC POWER GENERATION SYSTEM AND METHOD FOR SHUTTING DOWN THE SAME

CROSS REFERENCE

This application is based upon and claims priority to Chinese Patent Application No. 201610711762.1, filed on Aug. 23, 2016, the entire contents thereof are incorporated herein by reference.

TECHNICAL FIELD

The present disclosure generally relates to a field of solar photovoltaic power generation, and more particularly; to a photovoltaic power generation system and a method for shutting down the same.

BACKGROUND

Nowadays, the photovoltaic power is widely used on residential and commercial roof. A typical photovoltaic power generation system includes photovoltaic arrays, several junction boxes and an inverter, or the like. The photovoltaic array is configured to convert the harvested solar energy to DC (direct current) power. The inverter is used to convert the DC power to the desired AC (alternating current) power, to be on-grid or directly supplied to local load. A DC switch inside the junction box is used to shut down the input of a DC voltage from the photovoltaic array to the inverter.

The photovoltaic arrays connected in series and parallel bring high voltage and energy. When an emergency event (an earthquake, fire, or the like) occurs, the National Electric Code (2014, 2017) requests that the photovoltaic array with high voltage and high energy needs to be disconnected, to prevent the further hazards.

However, the DC switch in the junction box may only guarantee that no DC voltage will be connected to the inverter. Photovoltaic panels in the photovoltaic array still have high open-circuit output voltage. Still there is the risk of electric shock.

Currently, rapid shutdown devices are usually connected to the photovoltaic power generation system in series. A photovoltaic power generation system in the prior art is shown in FIG. 1. The photovoltaic power generation system 10 includes a plurality of photovoltaic arrays 11, a shutdown device 12, a junction box 13 and an inverter 14. The shutdown device 12 is connected in series between the output terminal of the photovoltaic arrays 11 and the DC input terminal of the inverter 14. With this connection type, the disconnecting element of the shutdown device 12 is in a closing state for a long time. During normal operation, the current flowing through the shutdown device 12 is quite large, so the disconnecting element may have a large heat generation due to the voltage drop on it, and the lifespan of the disconnecting element is vulnerable. In addition, the series-type shutdown device has high requirement on voltage endurance capability and current flow capability of disconnecting elements. Therefore, the volume of the shutdown device is relatively large and the cost is relatively high.

Therefore, a novel arrangement manner is required to rapidly shutdown the photovoltaic array.

The above information disclosed in the BACKGROUND is merely for better understanding of the context of the present disclosure, and may include contents that do not constitute the known prior art of those skilled in the art.

SUMMARY

The present disclosure provides a photovoltaic power generation system and a method for shutting down the same, which are capable of efficiently, stably; simply and rapidly shutting down the photovoltaic arrays.

The other characteristics and advantages of the present disclosure may become apparent from the following detailed description, or partly learned from the practice of the present disclosure.

According to one aspect of the present disclosure, there is provided a photovoltaic power generation system. The photovoltaic power generation system includes a plurality of photovoltaic arrays, a plurality of shutdown units and an inverter, wherein the photovoltaic arrays transfer electrical energy to a DC side of the inverter via a plurality of high voltage wires, and an AC side of the inverter is coupled to grid, and wherein the shutdown unit is adjacent to the corresponding photovoltaic array, connected in parallel with the corresponding photovoltaic array, and electrically connected to the inverter via the high voltage wires;

the photovoltaic power generation system includes a control unit configured to receive a detection signal from the inverter, monitor whether the AC side of the inverter is in a power-off state according to the detection signal, and generate a first power-off signal when the AC side of the inverter is in the power-off state; and the shutdown units are configured to receive the first power-off signal, and stop a power transmission from the photovoltaic arrays to the inverter according to the first power-off signal.

According to one aspect of the present disclosure, there is provided a method for shutting down a photovoltaic power generation system, wherein the photovoltaic power generation system includes a plurality of photovoltaic arrays and an inverter, the photovoltaic arrays transfer electrical energy to a DC side of the inverter via a plurality of high voltage wires, and an AC side of the inverter is coupled to grid, and wherein the method includes:

monitor whether the AC side of the inverter is in a power-off state according to a detection signal;

generating a first power-off signal when the AC side of the inverter is in the power-off state; and short-circuiting the photovoltaic array according to the first power-off signal, to stop a power transmission from the photovoltaic arrays to the inverter.

It is to be understood that both the foregoing general description and the following detailed description are exemplary only and are not restrictive of the present disclosure.

BRIEF DESCRIPTION OF THE DRAWINGS

The above and other objectives, features and advantages of the present disclosure will become more apparent by describing its exemplary embodiments in detail with reference to the accompanying drawings.

DETAILED DESCRIPTION

Figure 1:
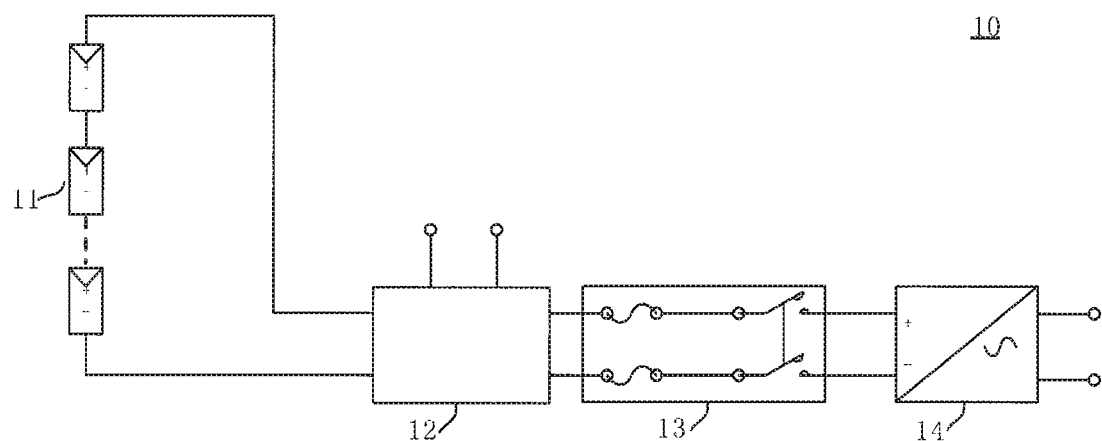
FIG. 1 shows a schematic diagram of a photovoltaic power generation system in the prior art.

Exemplary embodiments will now be described more fully with reference to the drawings. The exemplary embodiments, however, may be implemented in various forms, and should not be construed as been limited to the implementations set forth herein. The implementations are provided such that the present disclosure will be through and complete, and will fully convey the concept of exemplary embodiments to those skilled in the art. The accompanying drawings are only schematic illustration of the present disclosure, and may be not drawn to scale. In the drawings, the same reference numerals denote the same or similar structures, thus their detailed description will be omitted.

In addition, the features, structures or characteristics described herein can be combined in one or more embodiments in any appropriate way. In the description hereinafter, many specific details are provided for fully understanding the embodiments of the present disclosure. However, it will be appreciated by those skilled in the art that the technical solution of the present disclosure can be practiced without one or more of the specific details, or with other methods, components or steps, etc. in addition, known structures, methods, implementations or operations will not be illustrated or described in detail, to avoid obscuration of the aspects of the present disclosure.

Some block diagrams in the accompanying drawings represents some functional entities, which are not necessarily correspond to physical or logical independent entities. These functional entities may be implemented in the form of software, or in one or more hardware modules or integrated circuits, or in various networks and/or processing apparatus and/or micro control apparatus.

Figure 2:
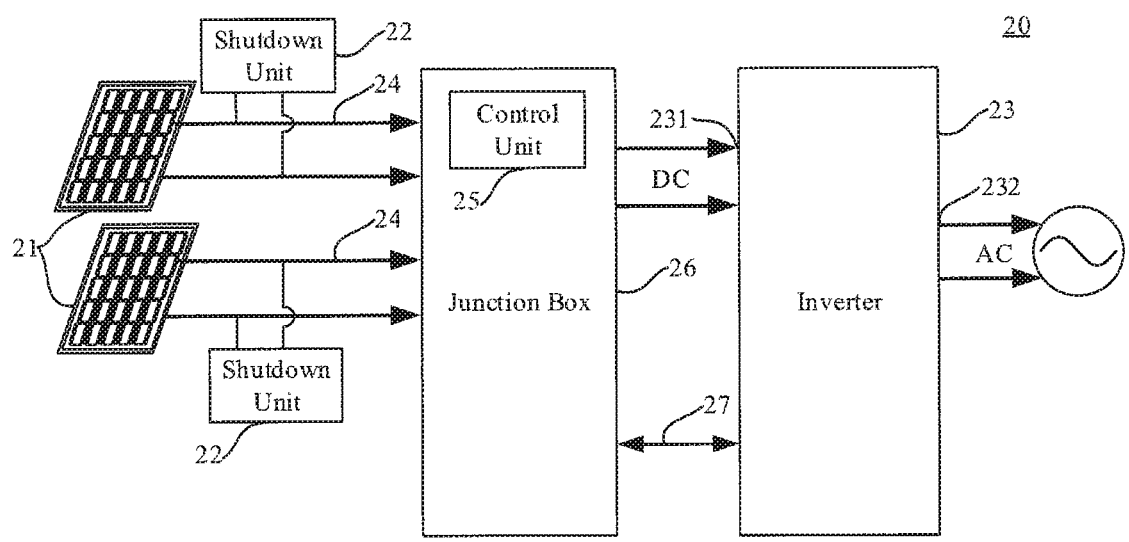
FIG. 2 shows a schematic diagram of a photovoltaic power generation system according to an exemplary embodiment of the present disclosure.

FIG. 2 shows a schematic diagram of a photovoltaic power generation system according to an exemplary embodiment of the present disclosure.

As shown in FIG. 2, a photovoltaic power generation system 20 includes two photovoltaic arrays 21, two shutdown units 22 and an inverter 23. The photovoltaic arrays 21 transfer electrical energy to a DC side 231 of the inverter 23 via high voltage wires 24, and an AC side 232 of the inverter 23 is coupled to grid.

The shutdown units 22 are adjacent to the corresponding photovoltaic array 21, connected in parallel with the corresponding photovoltaic arrays 21, and electrically connected to the inverter 23 via the high voltage wires 24. The photovoltaic power generation system 20 further includes a control unit 25. The control unit 25 is configured to receive a detection signal. The detection signal indicates a state of the AC side 232 of the inverter 23. According to the detection signal, the control unit 25 monitors whether the AC side 232 of the inverter 23 is in a power-off state. And the control unit 25 generates a first power-off signal when the AC side 232 of the inverter 23 is in the power-off state.

The shutdown units 22 are configured to receive the first power-off signal and short-circuit the photovoltaic arrays 21 and the DC input of the inverter 23 according to the first power-off signal.

The shutdown unit 22 is connected in parallel with the photovoltaic array 21 via the high voltage wires 24. When the inverter 23 is operating normally, the output current of the photovoltaic array 21 does not flow through the shutdown unit 22, to avoid power loss and heat generation in the devices of the shutdown unit 22. After an accident happens, a rescuer disconnects the output of the AC side 232 of the inverter 23. The inverter 23 sends the detection signal indicating the off-state of the AC side 232 to the control unit 25. The control unit 25 receives the detection signal and generates a first power-off signal to the shutdown units 22. The shutdown units 22 receive the first power-off signal, conduct a closing action, and bypass the high voltage output of the photovoltaic arrays 21. The voltage of the photovoltaic arrays 21 decrease to nearly zero due to the short circuiting connection. And the power transmission from the photovoltaic arrays 21 to the DC side 231 of the inverter 23 is stopped by the shutdown units 22. Therefore, the risk of potential hazard will reduce.

According to an exemplary embodiment, the photovoltaic power generation system 20 further includes a junction box 26 adjacent to the inverter 23. The junction box 26 is used for configuring leads at an input side and an output side of the inverter 23. In an embodiment as shown in FIG. 2, the control unit 25 may be positioned in the junction box 26 and communicate with the inverter 23 via a communication line 27 for receiving the detection signal from the inverter 23.

In the photovoltaic power generation system of the present embodiment, the shutdown unit 22 is connected in parallel with the photovoltaic array 21. During normal operation of the photovoltaic arrays 21, no current flows through the shutdown units 22, which avoid the device loss of the shutdown units 22 and prolong the service lifespan of the device. In addition, the parallel-type arrangement has low requirement on voltage endurance capability and current flow capability of disconnecting elements in the shutdown units 22. So the conventional disconnecting element such as a thyristor may be applicable in the shutdown unit 22, which reduces the volume and cost of the shutdown unit 22.

Figure 3:
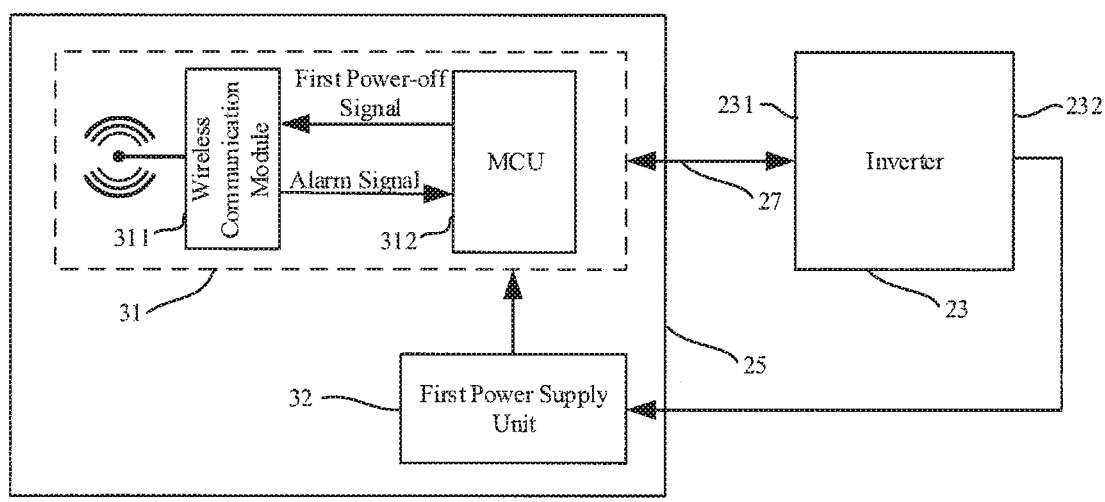
FIG. 3 shows a schematic diagram of a control unit according to an exemplary embodiment of the present disclosure.

FIG. 3 shows a schematic diagram of a control unit according to an exemplary embodiment of the present disclosure.

As shown in FIG. 3, the control unit 25 includes a first communication device 31 and a first power supply unit 32.

The first communication device 31 is configured to receive the detection signal indicating a state of the AC side 232 of the inverter 23, monitor whether the AC side 232 of the inverter 23 is in a power-off state according to the detection signal, and generate the first power-off signal when the AC side 232 of the inverter 23 is in the power-off state.

The first power supply unit 32 is electrically connected to the AC side 232 of the inverter 23, and configured to convert AC power output from the AC side 232 of the inverter 23 to DC power to supply power to the first communication device 31. Meanwhile, the first power supply unit 32 may be electrically connected to an auxiliary power supply inside the inverter 23. The auxiliary power supply is powered by the photovoltaic arrays 21 through a DC bus. When the AC side 232 is powered off, the first power supply unit 32 may be powered by the auxiliary power supply.

A communication circuit between the control unit 25 and the shutdown unit 22 has a variety of options. Taking wireless communication as an example, the first communication device 31 may include a wireless communication module 311 and a micro controller unit (MCU) 312. The wireless communication module 311 is configured to transmit the first power-off signal, and receive an alarm signal transmitted from the shutdown unit 22. The MCU 312 may communicate through software. A corresponding communication connection, for example RS485 communication, may be provided between the wireless communication module 311 and the MCU 312.

The MCU 312 performs a control function. The MCU 312 is configured to receive the detection signal from the inverter 23. And according to the detection signal, the MCU 312 monitors whether the AC side 232 of the inverter 23 is in a power-off state and generates the first power-off signal when the AC side 232 is in the power-off state. The MCU 312 also needs to communicate with the inverter 23. The MCU 312 may be connected to a connection port (not shown) of a communication board of the inverter 23 via the communication 27. The communication board is connected to a control board (not shown) of the inverter. Therefore, the detection signal from the inverter 23 may be transmitted to the control unit 25 via the communication line 27. The control unit 25 may also feed-back the alarm signal of the shutdown unit 22 to the inverter 23. The present embodiment provides a basic construction of the control unit 25, but the present disclosure is not limited thereto.

According to an exemplary embodiment, the detection signal for detecting the state of the AC side 232 of the inverter 23 may be AC voltage output from the AC side 232 of the inverter 23. When the AC voltage is lower than a first threshold value, the control unit 25 determines that the AC side 232 of the inverter 23 is in a power-off state. For example, when the detection signal the AC voltage output from the AC side 232 of the inverter 23, the control unit 25 compares the AC voltage with the first threshold value. If the AC voltage is lower than the first threshold value, the AC side 232 of the inverter 23 is powered off, and the first power-off signal is generated.

According to an exemplary embodiment, the detection signal for detecting the state of the AC side 232 of the inverter 23 may be DC voltage of the DC side 231 of the inverter 23. When the DC voltage is lower than a second threshold value, the control unit 25 determines that the AC side 232 of the inverter 23 is in a power-off state. For example, when the detection signal is the DC voltage of the DC side 231 of the inverter 23, the control unit 25 compares the DC voltage with the second threshold value. If the DC voltage is lower than the second threshold value, the AC side 232 of the inverter 23 is powered off, and the first power-off signal is generated.

Typically, the threshold value is 70% of the nominal value. Taking the first threshold value as an example, with respect to 240V AC grid, when the voltage of the AC side 232 is below 168V (i.e., 240*0.7=168V), the AC side 232 is considered to be powered off. As for the second threshold value, with respect to a 5V DC voltage, when the DC voltage of the DC side 231 is less than 3.5V (i.e., 5*0.7=3.5V), the AC side 232 is considered to be powered off. The above first threshold value and the above second threshold value are merely illustrative. The present disclosure is not limited thereto, and the first threshold value and the second threshold value may be adjusted according to actual needs.

Figure 4:
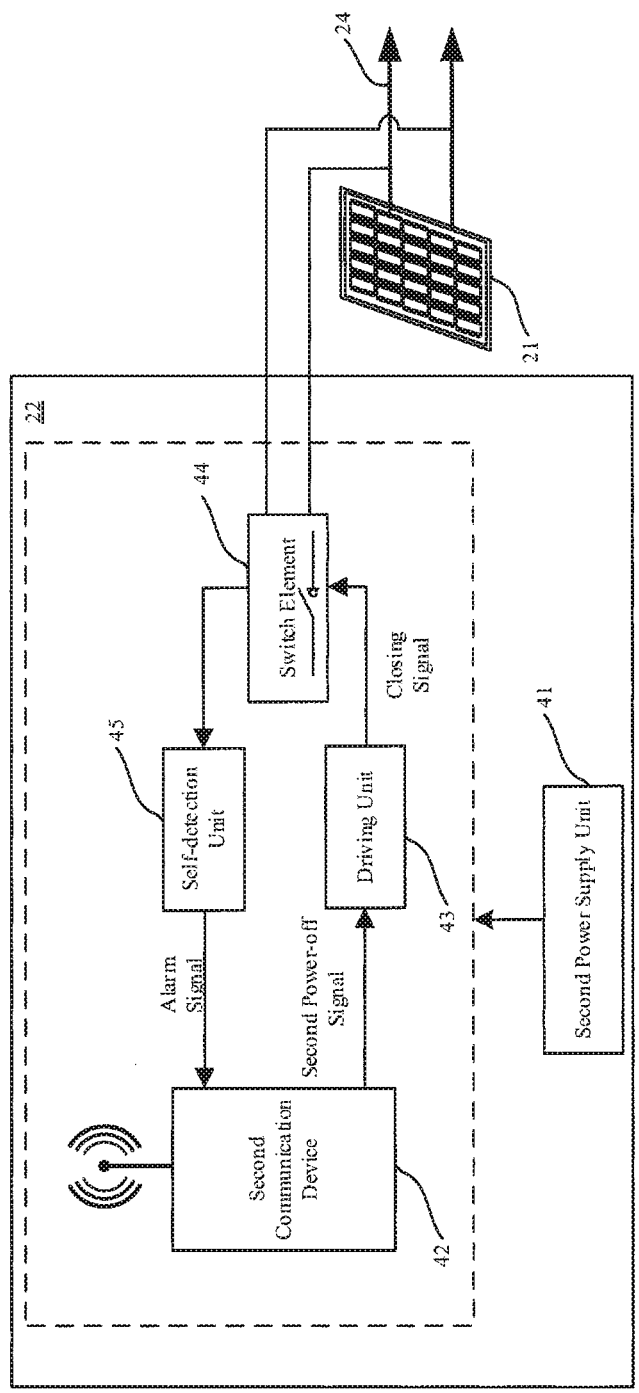
FIG. 4 shows a schematic diagram of a shutdown unit according to an exemplary embodiment of the present disclosure.

FIG. 4 shows a schematic diagram of a shutdown unit according to an exemplary embodiment of the present disclosure.

As shown in FIG. 4, the shutdown unit 22 includes a second power supply unit 41, a second communication device 42, a driving unit 43 and a switch element 44.

The second power supply unit 41 is configured to supply power to the shutdown unit 22. The second communication device 42 is configured to receive the first power-off signal generated from the control unit 25 and generate a second power-off signal according to the first power-off signal. The driving unit 43 is electrically connected to the second communication device 42 and configured to generate a closing signal according to the second power-off signal. The switch element 44 is connected in parallel with the photovoltaic array 21. The switch element 44 is electrically connected to the driving unit 43 and configured to conduct a closing action according to the closing signal. Therefore, the current output from the photovoltaic array 21 totally flows through the switch element 44. The photovoltaic array 21 is short-circuited, and the output voltage of the photovoltaic array 21 decreases to nearly zero due to the short circuiting connection. The power transmission from the photovoltaic arrays 21 to the DC side 231 of the inverter 23 is stopped by the shutdown units 22. The present embodiment provides a basic construction of the shutdown unit 22, but the present disclosure is not limited thereto.

In the embodiment, the driving unit 43 may be an amplifying circuit, which amplifies the second power-off signal to form the closing signal with sufficient power. And the closing signal with sufficient power is used to drive the switch element 44 to close. In an embodiment, the driving unit 43 may be constituted by a driving chip and some peripheral circuits, but not limited thereto.

According to an exemplary embodiment, the shutdown unit 22 further includes a self-detection unit 45. The self-detection unit 45 is configured to detect voltage information of the switch element 44 and monitor whether the switch element 44 is in a failure state. When the switch element 44 is in the failure state, the self-detection unit 45 generates an alarm signal. The alarm signal is transmitted to the control unit 25 via the second communication device 42. For example, the self-detection unit 45 may detect a voltage value across the switch element 44. When the switch element 44 needs to be opened, if the voltage across the switch element 44 is not equal to the output voltage of the photovoltaic array 21, the switch element 44 may be considered as invalid and the self-detection unit 45 generates an alarm signal. When the switch element 44 needs to be closed, if the voltage across the switch element 44 is not lower than 5 V, the switch element 44 may be considered as invalid and the self-detection unit 45 generates an alarm signal. The self-detection unit 45 may be collectively implemented in hardware and software, wherein the hardware circuit may sample the voltage across the switch element 44 and send it to the MCU 312, and the software performs algorithms on the input signal and produces a result.

According to art exemplary embodiment, the photovoltaic power generation system 20 may further include an alarm device (not shown). The alarm device may be adjacent to the inverter 23. If the switch element 44 fails, the alarm signal generated from the self-detection unit 45 may be transmitted to the alarm device through the second communication device 42 and the control unit 25. After that, the alarm device can be driven to sound an alarm, which prevents the rescue worker from danger.

Figure 5:
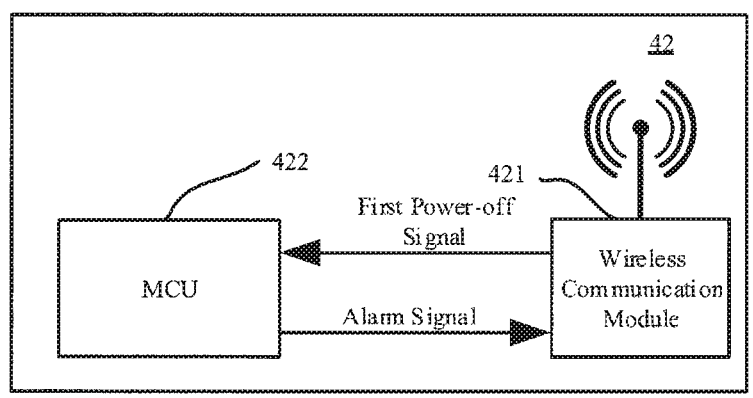
FIG. 5 shows a schematic diagram of a second communication device according to an exemplary embodiment of the present disclosure.

According to an exemplary embodiment, a communication circuit of the shutdown unit 22 has a variety of options. Taking wireless communication as an example, as shown in FIG. 5, the second communication device 42 may include a wireless communication module 421 and a micro controller unit (MCU) 422. The wireless communication module 421 may be implemented in a hardware circuit, such as an integrated wireless communication module. The wireless communication module can receive the first power-off signal transmitted from the wireless communication module 311 in the control unit 25 and send the received first power-off signal to the microcontroller unit MCU 422. It may also receive the alarm signal generated from the self-detection unit 45, and sends the received alarm signal to the first communication device 31 of the control unit 25. The MCU 422 is configured to receive the first power-off signal and generate the second power-off signal according to the first power-off signal.

According to an exemplary embodiment, a distance exists between the shutdown unit 22 and the photovoltaic array 21, and the distance may be equal to or smaller than 3 meters.

Figure 6:
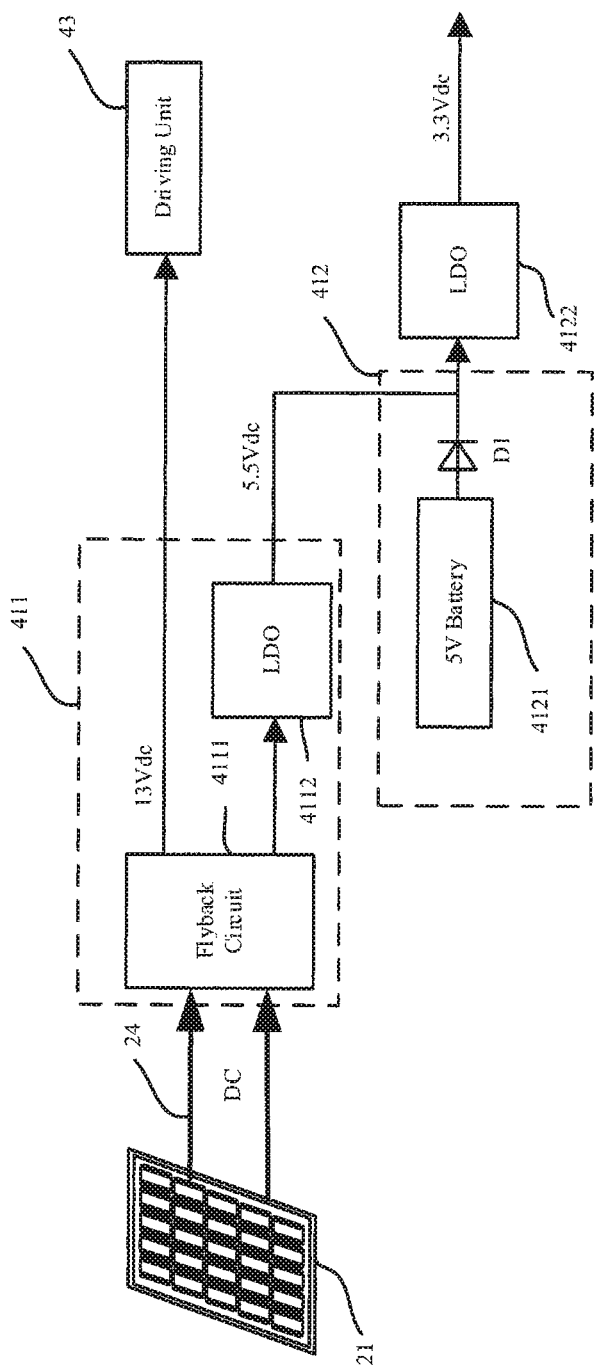
FIG. 6 shows a schematic diagram of a second power supply unit according to an exemplary embodiment of the present disclosure.

FIG. 6 shows a schematic diagram of a second power supply unit according to an exemplary embodiment of the present disclosure.

The second power supply unit 41 includes a photovoltaic power supply circuit 411 and a standby power supply circuit 412. During a normal operation, the shutdown unit 22 is powered by the photovoltaic power supply circuit 411. When the photovoltaic array 21 is short-circuited, the photovoltaic power supply circuit 411 no longer operates, and the shutdown unit 22 is powered by the standby power supply circuit 412 to ensure that the shutdown unit 22 operates normally.

As shown in FIG. 6, the photovoltaic power supply circuit 411 is electrically connected to the photovoltaic array 21, and configured to convert the DC voltage output from the photovoltaic array 21 to supply power to the shutdown unit 22. The photovoltaic power supply circuit 411 may include a flyback circuit 4111 and a voltage conversion device 4112. The flyback circuit 4111 is configured to receive high-voltage DC output from the photovoltaic array 21 and output 13V DC voltage to the driving unit 43 to supply power to the driving unit 43. In addition, the 13 V DC voltage is not only supplied to the driving unit 43, but also stepped-down and converted to 5.5V DC voltage through the voltage conversion device 4112, such as a low dropout regulator (LDO) 4112. The 5.5V DC voltage is connected in parallel with the output voltage of the standby power supply circuit 412. The 5.5V DC voltage or the output voltage of the standby power supply circuit 412 is converted to 3.3V voltage to supply power to other circuits in the shutdown unit 22.

As shown in FIG. 6, the standby power supply circuit 412 may include a 5V DC source and a diode D1, and the 5V DC source 4121 and the diode D1 are connected in series. The standby power supply circuit 412 is electrically connected to the 5.5V DC output voltage of the photovoltaic power supply circuit 411, and supplies standby power for the shutdown unit 22. In the embodiment, the 5V DC source may employ a 5V battery 4121 which is connected in parallel with 5.5V DC voltage via the diode D1. And the output voltage of the standby power supply circuit 412 is converted to 3.3V DC voltage after being stepped-down by the voltage conversion device 4122, such as a low dropout regulator (LDC)) 4122. When the photovoltaic array 21 is operating normally, the 5.5V DC voltage is output through the photovoltaic power supply circuit 411. Since the 5.5V DC voltage is higher than the voltage of the 5V battery 4121, the diode D1 is not conducted. The shutdown unit 22 is totally powered by the photovoltaic power supply circuit 411 at this time. In the event of an emergency, the photovoltaic array 21 is short-circuited, and the 5.5V DC voltage cannot be established. In this case, the diode D1 in the circuit is conducted and the shutdown unit 22 is powered by the 5V battery 4121.

Figure 7:
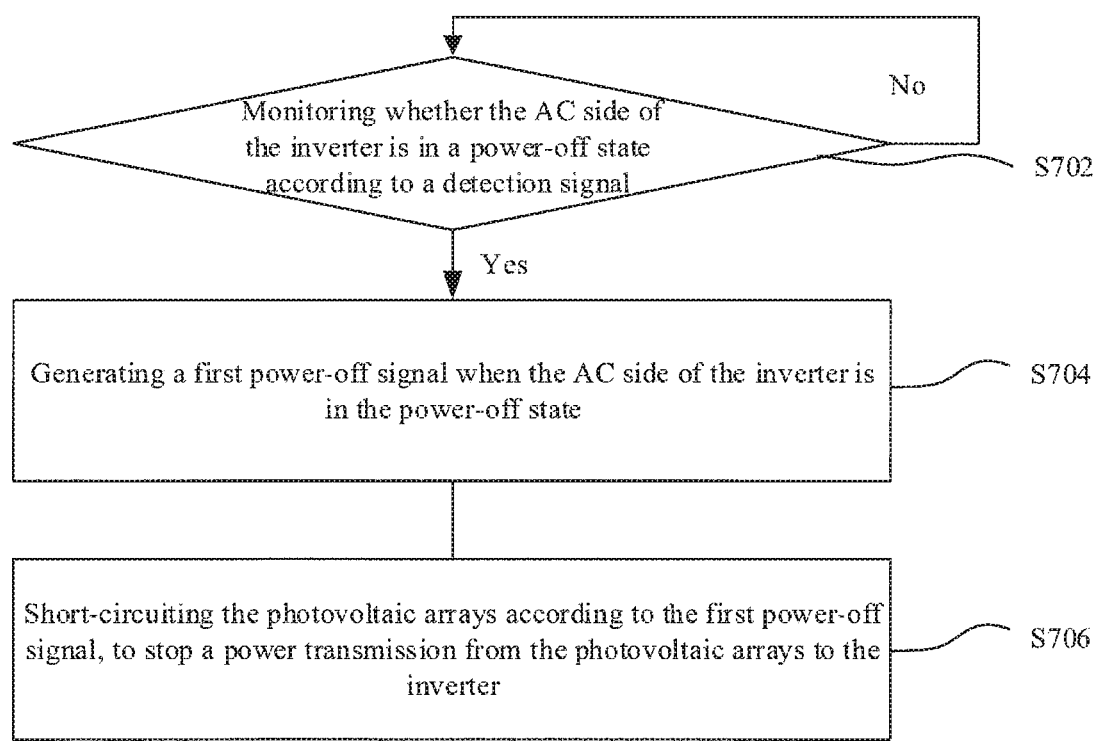
FIG. 7 shows a flow chart of a method for shutting down the photovoltaic power generation system according to an exemplary embodiment of the present disclosure.

FIG. 7 shows a flow chart of a method for shutting down the photovoltaic power generation system according to an exemplary embodiment of the present disclosure.

As shown in FIG. 2, the photovoltaic power generation system may include a plurality of photovoltaic arrays and an inverter. The photovoltaic arrays transfer electrical energy to a DC side of the inverter via high voltage wires, and an AC side of the inverter is coupled to grid. A method for shutting down the photovoltaic power generation system includes following steps S702~S706.

In step S702, it is monitored whether the AC side of the inverter is in a power-off state according to a detection signal.

It is detected whether the AC side of the inverter coupled to the grid is in the power-off state, that is, it is detected whether the AC side of the inverter is in the power-off state due to an accident. When the AC side of the inverter is in the power-off state, step S704 is performed; when the AC side of the inverter is not in the power-off state, step S702 is performed to continuously detect the state of AC side of the inverter.

In step S704, a first power-off signal is generated when the AC side of the inverter is in the power-off state.

If it is detected that the AC side of the inverter is in a power-off state, a first power-off signal is generated, for shutting down a power transmission from the photovoltaic arrays to the DC side of the inverter.

In step S706, the photovoltaic array is short-circuited according to the first power-off signal, and the output voltage of the photovoltaic arrays 21 decrease to nearly zero due to the short circuiting connection. The power transmission from the photovoltaic arrays 21 to the DC side 231 of the inverter 23 is stopped by the shutdown units 22.

According the first power-off signal, the photovoltaic array is short-circuited to bypass the high-voltage output of the photovoltaic array. The power transmission from the photovoltaic array to the DC side of the inverter s stopped. The risk of electric shock will reduce According to an embodiment, a plurality of shutdown units may be provided. The shutdown units are adjacent to the photovoltaic arrays, connected in parallel with the photovoltaic arrays, and connected to the inverter via the high voltage wires. The shutdown unit and the photovoltaic array are connected in parallel, so that the disconnecting element of the shutdown unit may be closed in the event of an accident to short-circuit the photovoltaic array.

According to the photovoltaic power generation system and the method for shutting down the same in the present embodiment, the output of the photovoltaic arrays decreases to nearly zero by short-circuiting the photovoltaic arrays when an accident happens, which prevents the rescuer from suffering the risk of electric shock and ensures his/her personal safety. At the same time, the shutdown unit and the photovoltaic array are connected in parallel, so that no current flows through the shutdown unit during a normal operation, which avoids the device loss of the shutdown unit and prolongs the service lifespan of the device. In addition, the parallel-type arrangement has low requirement on voltage endurance capability and current flow capability of disconnecting elements in the shutdown units. So a conventional disconnecting element such as a thyristor may be applicable, thereby reducing the volume and the cost of the shutdown units.

According to an exemplary embodiment, a control unit may be provided. The control unit includes a first communication device and a first power supply unit. The detection signal may be received through the first communication device. It is monitored whether the AC side of the inverter is in a power-off state according to the detection signal. And the first power-off signal is generated through the first communication device when the AC side of the inverter is in the power-off state. The first power supply unit may be electrically connected to the AC side of the inverter, and convert AC power output from the AC side to DC power to supply power to the first communication device.

According to an exemplary embodiment, the detection signal is AC voltage output from the AC side of the inverter, and it is determined that the AC side is in the power-off state when the AC voltage is lower than a first threshold value.

According to an exemplary embodiment, the detection signal is DC voltage output from DC side of the inverter, and determined that the AC side is in the power-off state when the DC voltage is lower than a second threshold value.

According to an exemplary embodiment, the shutdown unit may include a second power supply unit, a second communication device, a driving unit and a switch element. The shutdown unit may be powered by the second power supply unit. The first power-off signal may be received by the second communication device, and a second power-off signal is generate according to the first power-off signal. A closing signal may be generated through the driving unit according to the second power-off signal. The switch element is connected in parallel with the photovoltaic array. Meanwhile, the switch element is electrically connected to the driving unit and conducts a closing action according to the closing signal.

According to an exemplary embodiment, the shutdown unit may further include a self-detection unit. Voltage information of the switch element is detected through the self-detection unit, and it is monitored whether the switch element is in a failure state. An alarm signal is generated through the self-detection unit when the switch element is in the failure state. The alarm signal is transmitted to the control unit via the second communication device.

According to an exemplary embodiment, an alarm device may be provided. And the alarm device is adjacent to the inverter, and driven to sound an alarm through the control unit according to the alarm signal.

According to an exemplary embodiment, the second power supply unit may include a photovoltaic power supply circuit and a standby power supply circuit. The photovoltaic power supply circuit may be electrically connected to the photovoltaic array, and convert DC power output from the photovoltaic array to supply power to the shutdown unit. The standby power supply circuit may be electrically connected to the photovoltaic power supply circuit and provide standby power supply for the shutdown unit.

According to an exemplary embodiment, a distance may exist between the shutdown unit and the photovoltaic array, and the distance is equal to or smaller than 3 meters.

Exemplary embodiments of the present disclosure are illustrated and described above in detail. It should be appreciated that the present disclosure is not limited to the detailed structures, configurations or implementations described herein; rather, the present disclosure intends to cover various amendments and equivalents within the principle and scope of the appended claims.

What is claimed is:

1. A photovoltaic power generation system, comprising a plurality of photovoltaic arrays, a plurality of shutdown units and an inverter, wherein the photovoltaic arrays transfer electrical energy to a DC side of the inverter via a plurality of high voltage wires, and an AC side of the inverter is coupled to grid, and wherein
    the shutdown unit is adjacent to the corresponding photovoltaic array, connected in parallel with the corresponding photovoltaic array, and electrically connected to the inverter via the high voltage wires;
    the photovoltaic power generation system further comprises a control unit configured to receive a detection signal from the inverter, monitor whether the AC side of the inverter is in a power-off state according to the detection signal, and generate a first power-off signal when the AC side of the inverter is in the power-off state; and
    the shutdown units are configured to receive the first power-off signal, and stop a power transmission from the photovoltaic arrays to the inverter according to the first power-off signal,
    wherein each of the shutdown units comprises a second power supply unit, a second communication device, a driving unit and a switch element,
    the second power supply unit is configured to supply power to the shutdown unit;
    the second communication device is configured to receive the first power-off signal and generate a second power-off signal according to the first power-off signal;
    the driving unit is electrically connected to the second communication device and configured to generate a closing signal according to the second power-off signal; and
    the switch element is connected in parallel with the photovoltaic array and electrically connected to the driving unit, which is configured to conduct a closing action according to the closing signal.

2. The photovoltaic power generation system according to claim 1, wherein the control unit comprises a first communication device and a first power supply unit,
    the first communication device is configured to receive the detection signal, monitor whether the AC side of the inverter is in the power-off state according to the detection signal, and generate the first power-off signal when the AC side is in the power-off state; and
    the first power supply unit is electrically connected to the AC side of the inverter, and configured to convert AC power output from the AC side of the inverter to DC power and supply the DC power converted to the first communication device.

3. The photovoltaic power generation system according to claim 2, wherein the detection signal is an AC voltage output from the AC side of the inverter, and the control unit is configured to determine that the AC side of the inverter is in the power-off state when the AC voltage is lower than a first threshold value.

4. The photovoltaic power generation system according to claim 2, wherein the detection signal is a DC voltage output from the DC side of the inverter, and the control unit is configured to determine that the AC side of the inverter is in the power-off state when the DC voltage is lower than a second threshold value.

5. The photovoltaic power generation system according to claim 1, wherein the shutdown unit further comprises a self-detection unit, wherein the self-detection unit is configured to detect voltage information of the switch element, monitor whether the switch element is in a failure state, and generate an alarm signal when the switch element is in the failure state, and the alarm signal is transmitted to the control unit via the second communication device.

6. The photovoltaic power generation system according to claim 5, wherein the photovoltaic power generation system further comprises an alarm device, which is adjacent to the inverter, and the control unit is configured to drive the alarm device to sound an alarm according to the alarm signal.

7. The photovoltaic power generation system according to claim 1, wherein the second power supply unit comprises a photovoltaic power supply circuit and a standby power supply circuit,
the photovoltaic power supply circuit is electrically connected to the photovoltaic array, and configured to convert DC power output from the photovoltaic array to supply power to the shutdown unit; and
the standby power supply circuit is electrically connected to the photovoltaic power supply circuit, and configured to provide standby power to the shutdown unit.

8. The photovoltaic power generation system according to claim 1, wherein a distance exists between the shutdown unit and the photovoltaic array, and the distance is equal to or smaller than 3 meters.

9. A method for shutting down a photovoltaic power generation system, wherein the photovoltaic power generation system comprises a plurality of photovoltaic arrays and an inverter, the photovoltaic array transfers electrical energy to a DC side of the inverter via a plurality of high voltage wires, and an AC side of the inverter is coupled to grid, and wherein the method comprises:
Step1: monitoring whether the AC side of the inverter is in a power-off state according to a detection signal;
Step2: generating a first power-off signal when the AC side of the inverter is in the power-off state; and
Step3: short-circuiting the photovoltaic arrays according to the first power-off signal, to stop a power transmission from the photovoltaic arrays to the inverter,
wherein a plurality of shutdown units are provided, and the shutdown unit is adjacent to the corresponding photovoltaic array, connected in parallel with the corresponding photovoltaic array, and connected to the inverter via the high voltage wires,
wherein the shutdown unit comprises a second power supply unit, a second communication device, a driving unit and a switch element connected in parallel with the photovoltaic array and electrically connected to the driving unit, the shutdown unit is powered by the second power supply unit, and
the Step 3 further comprises:
receiving the first power-off signal through the second communication device, and generating a second power-off signal according to the first power-off signal;
generating a closing signal through the driving unit according to the second power-off signal; and
the switch element conducting a closing action according to the closing signal.

10. The method according to claim 9, wherein a control unit is provided, and the control unit comprises a first communication device and a first power supply unit, and the Step1 and the Step 2 further comprise:
receiving the detection signal through the first communication device;
monitoring whether the AC side of the inverter is in a power-off state according to the detection signal; and
generating the first power-off signal through the first communication device when the AC side is in the power-off state;
wherein the first power supply unit is electrically connected to the AC side of the inverter, and converts AC power output from the AC side of the inverter to supply power to the first communication device.

11. The method according to claim 9, wherein the detection signal is an AC voltage output from the AC side of the inverter, and the AC side of the inverter is in the power-off state when the AC voltage is lower than a first threshold value.

12. The method according to claim 9, wherein the detection signal is a DC voltage output from the DC side of the inverter, and the AC side of the inverter is in the power-off state when the DC voltage is lower than a second threshold value.

13. The method according to claim 9, wherein the shutdown unit further comprises a self-detection unit, wherein voltage information of the switch element is detected through the self-detection unit to monitor whether the switch element is in a failure state, an alarm signal is output through the self-detection unit when the switch element is in the failure state, and the alarm signal is transmitted to the control unit via the second communication device.

14. The method according to claim 13, wherein an alarm device is provided, which is adjacent to the inverter, and the alarm device is driven to sound an alarm through the control unit according to the alarm signal.

15. The method according to claim 9, wherein the second power supply unit comprises a photovoltaic power supply circuit and a standby power supply circuit,
the photovoltaic power supply circuit is electrically connected to the photovoltaic array, and converts DC power output from the photovoltaic array to supply power to the shutdown unit; and
the standby power supply circuit is electrically connected to the photovoltaic power supply circuit, and provides standby power to the shutdown unit.

16. The method according to claim 9, wherein a distance exists between the shutdown unit and the photovoltaic array, and the distance is equal to or smaller than 3 meters.

* * * * *